US012790683B2

(12) United States Patent
Nogami et al.

(10) Patent No.: US 12,790,683 B2
(45) Date of Patent: Nov. 10, 2026

(54) METHOD OF FORMING SILICON NITRIDE FILM

(71) Applicant: Tokyo Electron Limited, Tokyo (JP)

(72) Inventors: Takafumi Nogami, Nirasaki City (JP); Yoshiki Nakano, Nirasaki City (JP)

(73) Assignee: Tokyo Electron Limited, Tokyo (JP)

( * ) Notice: Subject to any disclaimer, the term of this patent is extended or adjusted under 35 U.S.C. 154(b) by 105 days.

(21) Appl. No.: 18/410,046

(22) Filed: Jan. 11, 2024

(65) Prior Publication Data

US 2024/0240307 A1 Jul. 18, 2024

(30) Foreign Application Priority Data

Jan. 13, 2023 (JP) ................................ 2023-004078

(51) Int. Cl.
*C23C 16/34* (2006.01)
*C23C 16/455* (2006.01)
*C23C 16/505* (2006.01)

(52) U.S. Cl.
CPC ...... *C23C 16/345* (2013.01); *C23C 16/45574* (2013.01); *C23C 16/505* (2013.01)

(58) Field of Classification Search
CPC ............ C23C 16/505; C23C 16/45575; C23C 16/345
See application file for complete search history.

(56) References Cited

U.S. PATENT DOCUMENTS

2009/0308840 A1* 12/2009 Kohno .............. H01L 21/02211 216/37
2014/0209562 A1* 7/2014 LaVoie .............. H01L 21/02164 216/2
2021/0324510 A1* 10/2021 Kuwano ............. C23C 16/0272

FOREIGN PATENT DOCUMENTS

WO 2008035678 A1 3/2008

OTHER PUBLICATIONS

Meng et al. Atomic Layer Deposition of Silicon Nitride Thin Films: A Review of Recent Progress, Challenges, and Outlooks Materials 2016, 9, 1007. (Year: 2016).*

* cited by examiner

*Primary Examiner* — Kelly M Gambetta
(74) *Attorney, Agent, or Firm* — Armstrong Teasdale LLP

(57) ABSTRACT

A method of forming a silicon nitride film includes: preparing a substrate in a processing container, the substrate having a graphene film on a surface of the substrate; supplying a nitrogen-containing gas into the processing container; supplying a Si precursor gas into the processing container after the nitrogen-containing gas is supplied and after a pressure control inside the processing container is stabilized; generating plasma within the processing container by supplying radio-frequency power for plasma generation after the Si precursor gas is supplied and before the pressure control inside the processing container is stabilized; and forming the silicon nitride film on the graphene film by exposing the substrate to the plasma.

14 Claims, 8 Drawing Sheets

METHOD OF FORMING SILICON NITRIDE FILM

CROSS-REFERENCE TO RELATED APPLICATION

This application is based upon and claims the benefit of priority from Japanese Patent Application No. 2023-004078, filed on Jan. 13, 2023, the entire contents of which are incorporated herein by reference.

TECHNICAL FIELD

The present disclosure relates to a method of forming a silicon nitride film.

BACKGROUND

In Patent Document 1, there is known a process of introducing a nitrogen-containing gas and a Si-containing gas, then outputting microwave from a microwave generator, and depositing a silicon nitride film on a wafer surface by a plasma CVD (Chemical Vapor Deposition) method.

PRIOR ART DOCUMENTS

Patent Documents

Patent Document 1: International Publication Pamphlet No. 2008/035678

SUMMARY

According to one embodiment of the present disclosure, there is provided a method of forming a silicon nitride film. The method of forming the silicon nitride film includes: preparing a substrate in a processing container, the substrate having a graphene film on a surface of the substrate; supplying a nitrogen-containing gas into the processing container; supplying a Si precursor gas into the processing container after the nitrogen-containing gas is supplied and after a pressure control inside the processing container is stabilized; generating plasma within the processing container by supplying radio-frequency power for plasma generation after the Si precursor gas is supplied and before the pressure control inside the processing container is stabilized; and forming the silicon nitride film on the graphene film by exposing the substrate to the plasma.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
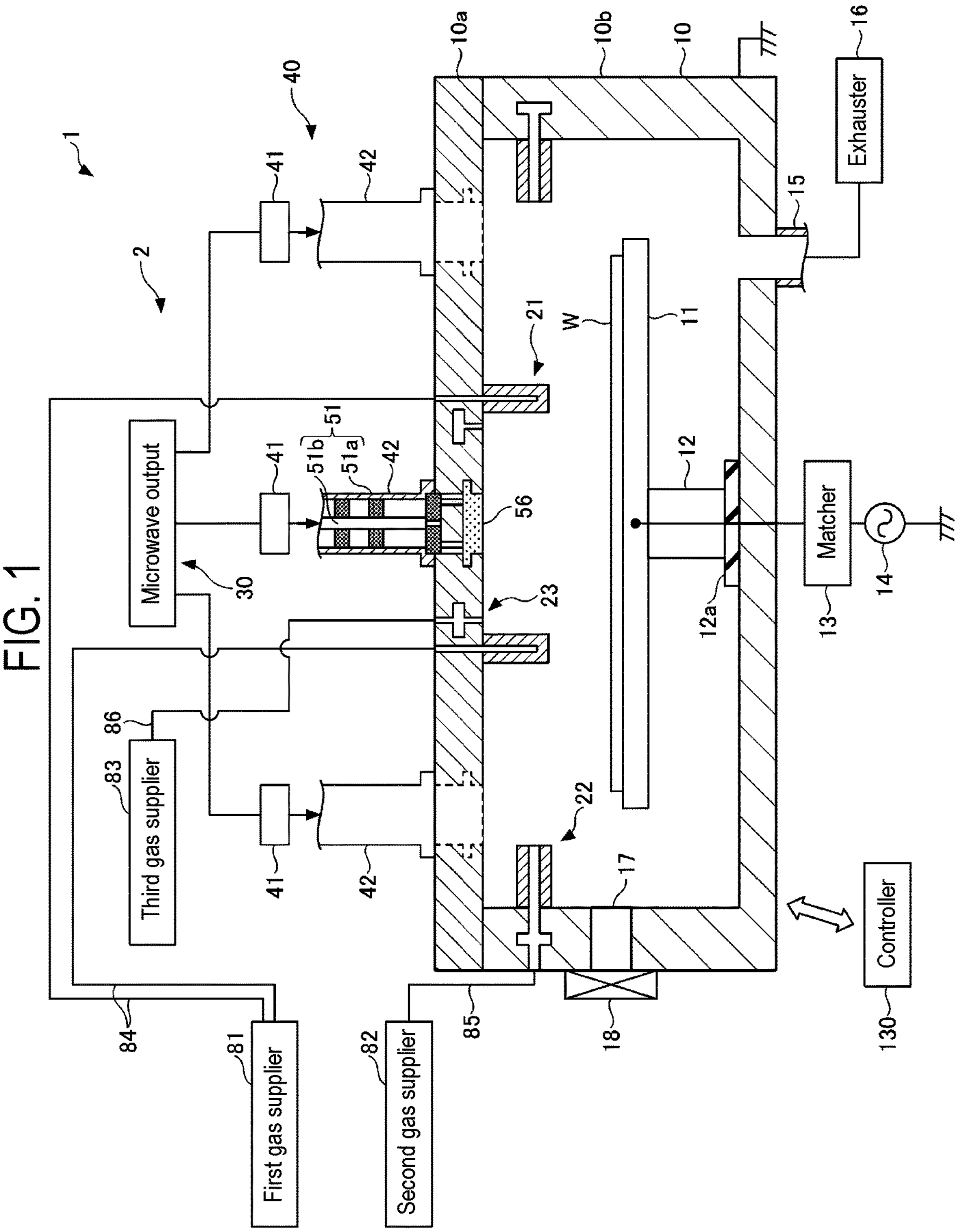
FIG. 1 is a diagram showing a configuration example of a plasma processing apparatus including a microwave plasma source according to one embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments for implementing the present disclosure will be described with reference to the drawings. In each drawing, the same components are designated by like reference numerals, and the redundant description thereof may be omitted.

[Plasma Processing Apparatus]

An example of the configuration of a plasma processing apparatus that executes a film forming method according to one embodiment will be described with reference to FIG. 1. FIG. 1 is a diagram showing a configuration of a plasma processing apparatus 1 including a microwave plasma source according to one embodiment. The plasma processing apparatus 1 is a film forming apparatus that forms a silicon nitride film on a substrate W. The silicon nitride film is any one of a SiN film, a SiON film, a SiCN film, and a SiOCN film. In the following description, the plasma processing apparatus 1 will be described by using an example in which a SiN film is formed on a substrate W.

The plasma processing apparatus 1 includes a processing container 10 and a plasma source 2. The processing container 10 has a substantially cylindrical shape. The processing container 10 is configured to be airtight and is made of a metal material such as aluminum or the like. The processing container 10 is grounded. The plasma source 2 introduces microwave into the processing container 10 to form a surface wave plasma. A ceiling wall (top wall) 10*a* of the processing container 10 is configured by fitting dielectric members (hereinafter referred to as dielectric windows 56) of microwave radiation mechanisms 42 into a metal main body. Thus, the plasma source 2 introduces microwave into the processing container 10 through the dielectric windows 56 of the ceiling wall 10*a*.

The plasma processing apparatus 1 includes a controller 130. The controller 130 is, for example, a computer, and includes a program storage part (not shown). The program storage part stores a program for controlling the processing of a substrate W, an example of which is a semiconductor wafer, in the plasma processing apparatus 1. The program may be recorded on a non-transitory computer-readable storage medium such as a computer-readable hard disk (HD), a flexible disk (FD), a compact disk (CD), a magneto-optical disk (MO), or memory card, and may be installed in the controller 130 from the storage medium.

A stage 11 that horizontally supports the substrate W is installed in the processing container 10 in a state in which the stage 11 is supported by a cylindrical support member 12 installed upright at the center of the bottom of the processing container 10 with an insulating member 12*a* interposed between the support member 12 and the center of the bottom of the processing container 10. The material constituting the stage 11 and the support member 12 is, for example, a metal such as aluminum whose surface is alumite-treated (anodized) or an insulating material (ceramic or the like) having a radio-frequency electrode therein.

Although not shown, the stage 11 is provided with a temperature control mechanism, a gas flow path configured to supply a heat transfer gas to a rear surface of the substrate W, lift pins configured to move up and down to transfer the substrate W, and the like. In addition, the stage 11 may be provided with an electrostatic chuck for electrostatically attracting the substrate W.

Furthermore, an RF bias power source 14 is electrically connected to the stage 11 via a matcher 13. By supplying RF bias power from the RF bias power source 14 to the stage 11, ions in the plasma are drawn toward the substrate W, thereby contributing to improvement of film quality and in-plane uniformity.

An exhaust pipe 15 is connected to the bottom side of the processing container 10, and an exhauster 16 including a vacuum pump is connected to the exhaust pipe 15. By operating the exhauster 16, the inside of the processing container 10 can be evacuated, and the inside of the processing container 10 can be depressurized to a predetermined pressure. The exhauster 16 includes a vacuum pump, an APC (Adaptive Pressure Controller) valve, a pressure sensor, and the like, all of which are not shown. The pressure sensor may be provided within the processing container 10. Further, the side wall 10*b* of the processing container 10 is provided with a loading/unloading port 17 for loading/unloading the substrate W, and a gate valve 18 for opening/closing the loading/unloading port 17.

The plasma processing apparatus 1 also includes a first gas shower portion (first gas supply hole) 21 and a third gas shower portion (third gas supply hole) 23, both of which supply predetermined gases into the processing container 10 from the ceiling wall 10*a* of the processing container 10. The plasma processing apparatus 1 further includes a second gas shower portion (second gas supply hole) 22 which supplies a predetermined gas into the processing container 10 from the side wall 10*b* of the processing container 10. The third gas shower portion 23 supplies a predetermined gas into the processing container 10 from the ceiling wall 10*a* of the processing container 10. The first gas shower portion 21 supplies a gas from a position between the ceiling wall 10*a* and the stage 11. The second gas shower portion 22 supplies a gas from a position between the ceiling wall 10*a* and the stage 11 in the processing container 10 and outside the first gas shower portion 21 in the radial direction (horizontal direction).

Although the first gas shower portion 21 and the third gas shower portion 23 are shown at positions shifted in the radial direction in FIG. 1 for the sake of convenience, they are provided alternately on the same circle. The third gas shower portion 23 is provided on the top wall of the processing container 10 to supply the gas carried from the third gas supplier 83 through a gas line 86 from a third position. The first gas shower portion 21 is provided on the top wall of the processing container 10 to supply the gas carried from the first gas supplier 81 through a gas line 84 from a first position lower than the third position. The second gas shower portion 22 is provided on the side wall of the processing container 10 to supply the gas carried from the second gas supplier 82 through a gas line 85 from a second position lower than the third position.

Raw material gases (film forming gases) are supplied from the first gas shower portion 21 and the second gas shower portion 22. For example, when forming a SiN film, a Si precursor gas is supplied from the first gas shower portion 21 and the second gas shower portion 22. The Si precursor gas includes, for example, at least one of a silane ($SiH_4$) gas, a dichlorosilane (DCS) gas, or organic silane gas, and the like. In the following description, the Si precursor gas will be described as being a $SiH_4$ gas.

A reaction gas (nitriding gas) is supplied from the third gas shower portion 23. Further, for example, when forming a SiN film, a nitrogen-containing gas is supplied from the third gas shower portion 23. The nitrogen-containing gas includes, for example, at least one of an $N_2$ gas, an $NH_3$ gas, or a mixed gas of $N_2$ and $H_2$. In the following description, the nitrogen-containing gas will be described as being an $N_2$ gas or an $NH_3$ gas.

Further, the film forming gases may be supplied from at least one of the first gas shower portion 21 or the second gas shower portion 22. By supplying the film forming gas from at least one of the first position lower than the third position or the second position lower than the third position, it is possible to suppress gas dissociation.

Processing gases other than the film forming gases may be supplied from the first gas shower portion 21, the second gas shower portion 22, and the third gas shower portion 23. Further, a dilution gas may be supplied from the first gas shower portion 21, the second gas shower portion 22, and the third gas shower portion 23. For example, the gases supplied from the first gas shower portion 21 and the second gas shower portion 22 may include, in addition to the Si-containing gas ($SiH_4$), a carbon-containing gas (e.g., a $C_2H_6$ gas), a nitrogen-containing gas (e.g., an $N_2$ gas or an $NH_3$ gas), a dilution gas (e.g., an Ar gas or a He gas), and the like. Further, for example, the gas supplied from the third gas shower portion 23 may include, in addition to the nitrogen-containing gas (e.g., the $N_2$ gas or the $NH_3$ gas), a dilution gas (e.g., an Ar gas or a He gas), a fluorine-containing gas (e.g., an $NF_3$ gas), an oxygen-containing gas (e.g., an $O_2$ gas), and the like. Further, the Ar gas or the He gas as the dilution gas may be used as a plasma excitation gas.

Furthermore, when supplying multiple gases, the first gas supplier 81, the second gas supplier 82, and the third gas supplier 83 are configured to be able to individually control the supply and stop of the respective gases.

By supplying the Si precursor gas and the nitrogen-containing gas into the processing container 10, the plasma processing apparatus 1 forms a SiN film as a silicon nitride film on the substrate W. By supplying the Si precursor gas, the nitrogen-containing gas, and the oxygen-containing gas into the processing container 10, the plasma processing apparatus 1 forms an SiON film as a silicon nitride film on the substrate W. By supplying the Si precursor gas, the nitrogen-containing gas, and the carbon-containing gas into the processing container 10, the plasma processing apparatus 1 forms a SiCN film as a silicon nitride film on the substrate W. By supplying the Si precursor gas, the nitrogen-containing gas, the oxygen-containing gas, and the carbon-containing gas into the processing container 10, the plasma processing apparatus 1 forms a SiOCN film as a silicon nitride film on the substrate W.

Further, by supplying a fluorine-containing gas as a cleaning gas into the processing container 10, it is possible to remove deposits within the processing container 10.

The plasma source 2 includes a microwave output 30 that outputs microwave to be distributed over paths, and a microwave transmitter 40 that transmits the microwave outputted from the microwave output 30.

The microwave output 30 includes a microwave power source, a microwave oscillator, an amplifier, and a distributor (not shown). The microwave power source supplies electric power to the microwave oscillator. For example, the microwave oscillator generates PLL-oscillation of microwave having a predetermined frequency (e.g., 860 MHz). The amplifier amplifies the oscillated microwave. The distributor distributes the microwave amplified by the amplifier while matching the impedance between the input and output to minimize microwave loss. As the frequency of the microwave, in addition to 860 MHz, various frequencies in the range of 700 MHz to 3 GHz, such as 915 MHz, may be used.

The microwave transmitter 40 includes amplifiers 41 and microwave radiation mechanisms 42 provided corresponding to the amplifiers 41. Seven microwave radiation mechanisms 42 are arranged, for example, one at the center of the ceiling wall 10*a* and six at equal intervals on the circumference around the center. In this example, the microwave radiation mechanisms 42 are arranged so that the distance between the microwave radiation mechanism 42 at the center and the microwave radiation mechanisms 42 at the outer periphery is equal to the distance between the microwave radiation mechanisms 42 at the outer periphery.

The amplifier 41 guides the microwave distributed by the distributor to the respective microwave radiation mechanisms 42. The microwave radiation mechanism 42 includes a coaxial tube 51. The coaxial tube 51 has a coaxial microwave transmission path including a tubular outer conductor 51*a* and a rod-shaped inner conductor 51*b* provided at the center of the outer conductor 51*a*. The microwave radiation mechanism 42 includes a feed antenna (not shown) that feeds the microwave amplified by the amplifier 41 to the coaxial tube 51. Further, the microwave radiation mechanism 42 includes a tuner that matches the impedance of a load to the characteristic impedance of the microwave power source, and an antenna that radiates the microwave from the coaxial tube 51 into the processing container 10.

The antenna is provided at the lower end of the coaxial tube 51, and is fitted into a metal portion of the ceiling wall 10*a* of the processing container 10. The antenna includes the dielectric window 56. The microwave transmitted through the dielectric window 56 generates surface wave plasma in a portion directly below the dielectric window 56 in the processing container 10.

Plasma sources 2 (dielectric windows 56) are provided, one at the center of the ceiling and six at the outer periphery of the ceiling. Each of the plasma sources 2 (dielectric window 56) can independently control the microwave power supplied from each plasma source 2. The microwave power supplied from the plasma source 2 (dielectric window 56) at the outer periphery may be higher than or equal to the microwave power supplied from the plasma source 2 at the center.

The film forming method of this embodiment can be executed in the plasma processing apparatus 1 that supplies microwave power from the plasma source 2 arranged on the top wall of the processing container 10.

[Method of Forming Silicon Nitride Film]

Figure 2:
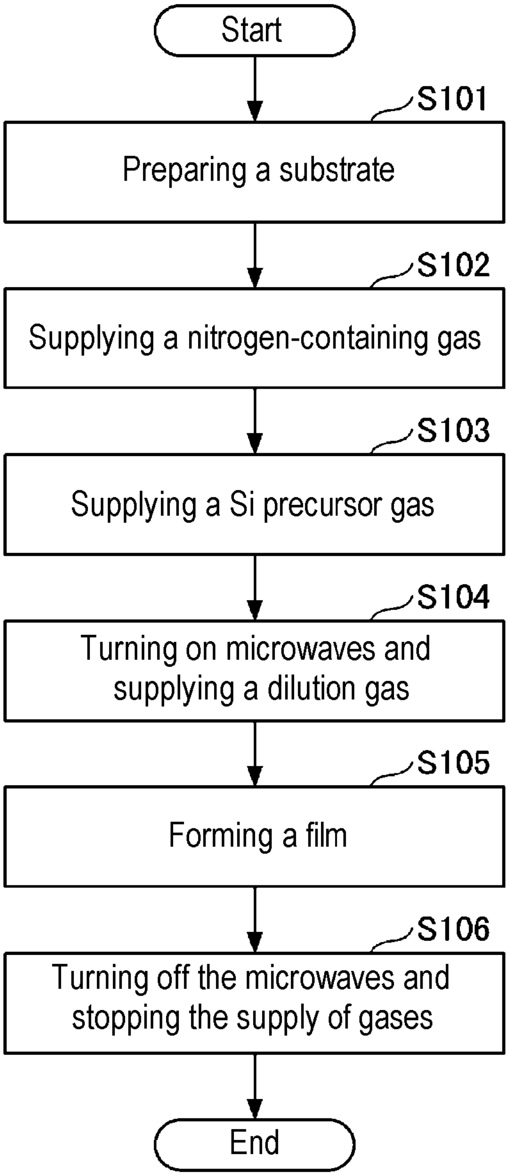
FIG. 2 is an example of a flowchart showing a method of forming a silicon nitride film according to one embodiment.
Figure 3:
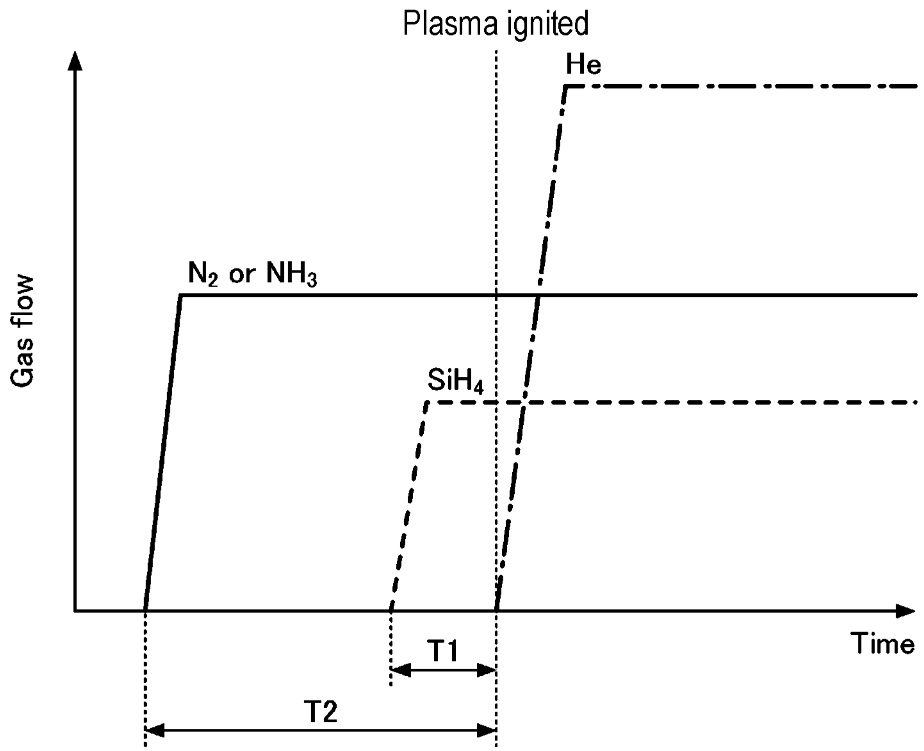
FIG. 3 is an example of a diagram showing a sequence of the method of forming a silicon nitride film according to one embodiment.

Next, a method of forming a silicon nitride film on the substrate W using the plasma processing apparatus 1 will be described with reference to FIGS. 2 and 3. FIG. 2 is an example of a flowchart showing a method of forming a silicon nitride film according to one embodiment. FIG. 3 is an example of a diagram showing a sequence of the method of forming the silicon nitride film according to one embodiment.

In step S101, a substrate W is loaded into the processing container 10 of the plasma processing apparatus 1 and is mounted on the stage 11 to prepare the substrate W. In this case, a graphene film is formed on the substrate W. In this regard, the graphene film is a film that may be consumed by exposure to plasma.

In step S102, the supply of a nitrogen-containing gas ($N_2$ gas or $NH_3$ gas) is started. The nitrogen-containing gas is supplied from the third gas shower portion 23 into the processing container 10. By starting the supply of the nitrogen-containing gas, the pressure inside the processing container 10 fluctuates. The controller 130 controls the opening degree of the APC valve of the exhauster 16 to control the pressure inside the processing container 10 to a predetermined pressure.

In step S103, after the nitrogen-containing gas is supplied and after the pressure control inside the processing container 10 is stabilized, in other words, after the opening degree control of the APC valve of the exhauster 16 that controls the pressure inside the processing container 10 is stabilized, the supply of a Si precursor gas ($SH_4$) is started. In this step, from step S102, the nitrogen-containing gas continues to be supplied from the third gas shower portion 23 into the processing container 10. Further, the Si precursor gas is supplied into the processing container 10 from the first gas shower portion 21. By starting the supply of the Si precursor gas in addition to the supply of the nitrogen-containing gas, the pressure inside the processing container 10 fluctuates. The controller 130 controls the opening degree of the APC valve of the exhauster 16 to control the pressure inside the processing container 10 to a predetermined pressure.

In step S104, after the Si precursor gas is supplied and before the pressure control within the processing container 10 is stabilized, in other words, before the opening degree control of the APC valve is stabilized, the microwave is turned on (applied) and the supply of a dilution gas (He gas) is started. In this step, from step S103, the nitrogen-containing gas continues to be supplied into the processing container 10 from the third gas shower portion 23, and the Si precursor gas continues to be supplied into the processing container 10 from the first gas shower portion 21. Further, a dilution gas is supplied into the processing container 10 from the second gas shower portion 22. As a result, microwave power is supplied into the processing container 10, and plasma is ignited by the nitrogen-containing gas ($N_2$ or $NH_3$) and the dilution gas (He gas). Furthermore, by starting the supply of the dilution gas in addition to the supply of the nitrogen-containing gas and the Si precursor gas, the pressure inside the processing container 10 fluctuates. The controller 130 controls the opening degree of the APC valve of the exhauster 16 to control the pressure inside the processing container 10 to a predetermined pressure.

Further, in step S104, the Si precursor gas may be supplied from the second gas shower portion 22 into the processing container 10 together with the dilution gas. In this regard, the flow rate ratio of the Si precursor gas supplied from the first gas shower portion 21 to the Si precursor gas supplied from the second gas shower portion 22 may be 1:7 or more and 1:3 or less.

In step S105, the substrate W is exposed to the generated plasma of the processing gas to form a SiN film.

In step S106, the microwave is turned off. As a result, the supply of microwave power into the processing container 10 is stopped. Further, in step S106, the supply of the gases (the nitrogen-containing gas, the Si precursor gas, and the dilution gas) is stopped. Thus, the process is terminated.

There is a first period T1 from the start of supply of the Si precursor gas (S103) to the start of application of the microwave (S104). The first period T1 is shorter than the time required for stabilizing the pressure fluctuation in the processing container 10 after starting the supply of the Si precursor gas. For example, the first period T1 is preferably 1 second or more and 10 seconds or less, more preferably 2 seconds or more and 6 seconds or less.

Furthermore, there is a second period T2 from the start of supply of the nitrogen-containing gas (S102) to the start of application of the microwave (S104). The second period T2 is longer than the time required for stabilizing the pressure fluctuation in the processing container 10 after starting the supply of the nitrogen-containing gas. For example, the second period T2 is 20 seconds or more.

In addition, the period (T2−T1) from the start of supply of the nitrogen-containing gas (S102) to the start of supply of the Si precursor gas (S103) is longer than the time required for stabilizing the pressure fluctuation inside the processing container 10 after starting the supply of the nitrogen-containing gas. For example, the period (T2−T1) is preferably 10 seconds or more.

Although it has been described that the supply of the Si precursor gas into the processing container 10 from the first gas shower portion 21 is started in step S103, and the supply of the Si precursor gas into the processing container 10 from the second gas shower portion 22 may be started in step S104, the present disclosure is not limited thereto. In step S103, the supply of the Si precursor gas into the processing container 10 from the first gas shower portion 21 and the second gas shower portion 22 may be started.

Further, the dilution gas is not limited to being supplied from the second gas shower portion 22, and may be supplied from at least one of the first gas shower portion 21, the second gas shower portion 22, or the third gas shower portion 23.

An example of process conditions for forming a silicon nitride film is as follows.

<Process Conditions>

$SiH_4$ flow rate: 10 sccm to 100 sccm

Pressure inside processing container 10: 6 Pa to 133 Pa

Microwave power: 1,000 to 6,000 W

Figure 4:
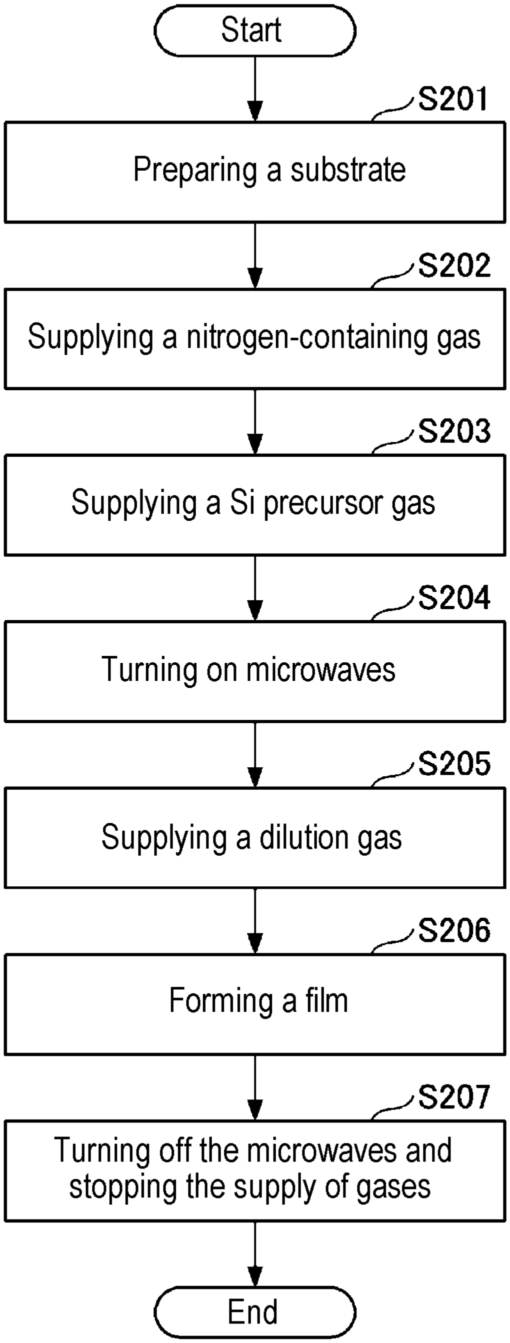
FIG. 4 is another example of a flowchart showing a method of forming a silicon nitride film according to one embodiment.
Figure 5:
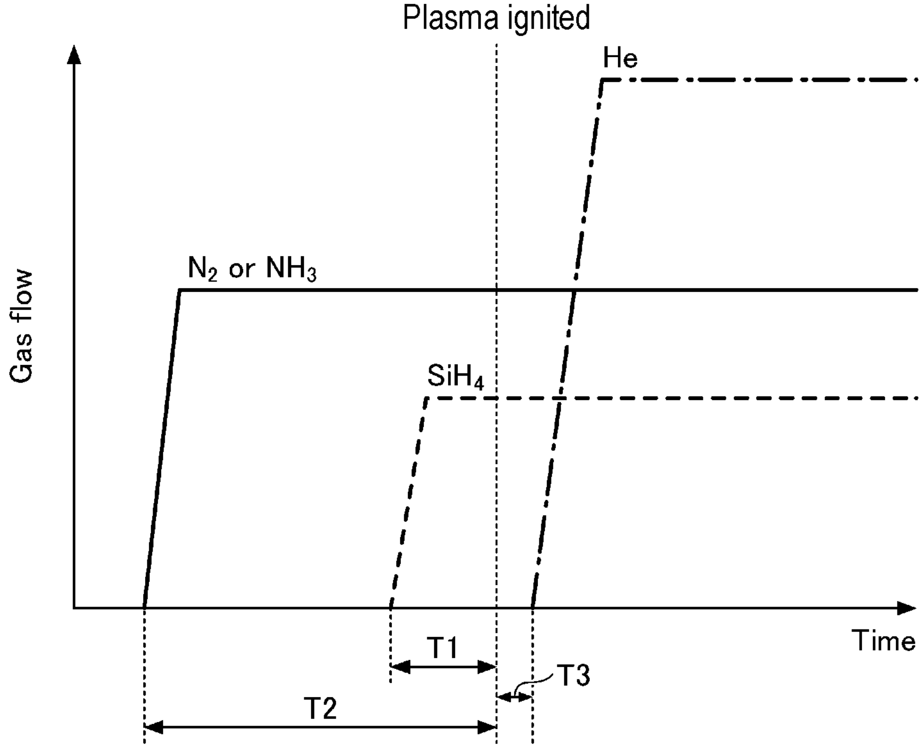
FIG. 5 is another example of the diagram showing the sequence of the method of forming the silicon nitride film according to one embodiment.

Next, another method of forming a silicon nitride film on the substrate W using the plasma processing apparatus 1 will be described with reference to FIGS. 4 and 5. FIG. 4 is another example of a flowchart showing a method of forming a silicon nitride film according to one embodiment. FIG. 5 is another example of a diagram showing a sequence of the method of forming the silicon nitride film according to one embodiment.

In step S201, the substrate W is loaded into the processing container 10 of the plasma processing apparatus 1 and is mounted on the stage 11 to prepare the substrate W. In this case, a graphene film is formed on the substrate W. The graphene film is a film that may be consumed by exposure to plasma.

In step S202, the supply of a nitrogen-containing gas ($N_2$ gas or $NH_3$ gas) is started. In this case, the nitrogen-containing gas is supplied from the third gas shower portion 23 into the processing container 10. By starting the supply of the nitrogen-containing gas, the pressure inside the processing container 10 fluctuates. The controller 130 controls the opening degree of the APC valve of the exhauster 16 to control the pressure inside the processing container 10 to a predetermined pressure.

In step S203, after the nitrogen-containing gas is supplied and after the pressure control inside the processing container 10 is stabilized, in other words, after the opening degree control of the APC valve of the exhauster 16 that controls the pressure inside the processing container 10 is stabilized, the supply of a Si precursor gas ($SiH_4$) is started. In this step, from step S202, the nitrogen-containing gas continues to be supplied from the third gas shower portion 23 into the processing container 10. Further, a Si precursor gas is supplied into the processing container 10 from the first gas shower portion 21. By starting the supply of the Si precursor gas in addition to the supply of the nitrogen-containing gas, the pressure inside the processing container 10 fluctuates. The controller 130 controls the opening degree of the APC valve of the exhauster 16 to control the pressure inside the processing container 10 to a predetermined pressure.

In step S204, after the Si precursor gas is supplied and before the pressure control in the processing container 10 is stabilized, in other words, before the opening degree control of the APC valve is stabilized, the microwave is turned on (applied). In this step, from step S203, the nitrogen-containing gas continues to be supplied from the third gas shower portion 23 into the processing container 10, and the Si precursor gas continues to be supplied from the first gas shower portion 21 (and the second gas shower portion 22) into the processing container 10. As a result, microwave power is supplied into the processing container 10, and plasma is ignited by the nitrogen-containing gas ($N_2$ gas or $NH_3$ gas) and the Si precursor gas. When plasma is generated in the processing container 10 by turning on (applying) the microwave, the pressure inside the processing container 10 fluctuates. The controller 130 controls the opening degree of the APC valve of the exhauster 16 to control the pressure inside the processing container 10 to a predetermined pressure.

In step S205, after the microwave is turned on (applied) and after the pressure control inside the processing container 10 is stabilized, in other words, after the opening degree control of the APC valve of the exhauster 16 that controls the pressure inside the processing container 10 is stabilized, the supply of a dilution gas (He gas) is started. In this step, from step S204, the nitrogen-containing gas continues to be supplied from the third gas shower portion 23 into the processing container 10, and the Si precursor gas continues to be supplied into the processing container 10 from the first gas shower portion 21. Further, the dilution gas is supplied into the processing container 10 from the second gas shower portion 22. Furthermore, by starting the supply of the dilution gas in addition to the supply of the nitrogen-containing gas and the Si precursor gas, the pressure inside the processing container 10 fluctuates. The controller 130 controls the opening degree of the APC valve of the exhauster 16 to control the pressure inside the processing container 10 to a predetermined pressure.

Further, in step S205, the Si precursor gas may be supplied from the second gas shower portion 22 into the processing container 10 together with the dilution gas. In this case, the flow rate ratio of the Si precursor gas supplied from the first gas shower portion 21 to the Si precursor gas supplied from the second gas shower portion 22 may be 1:7 or more and 1:3 or less.

In step S206, the substrate W is exposed to the generated plasma of the processing gas to form a SiN film.

In step S207, the microwave is turned off. As a result, the supply of the microwave power into the processing container 10 is stopped. Further, in step S207, the supply of the gases (the nitrogen-containing gas, the Si precursor gas, and the dilution gas) is stopped. Thus, the process is terminated.

There is a first period T1 from the start of supply of the Si precursor gas (S203) to the start of application of the microwave (S204). The first period T1 is shorter than the time required for stabilizing the pressure fluctuation in the processing container 10 after starting the supply of the Si precursor gas. For example, the first period T1 is preferably 1 second or more and 10 seconds or less, more preferably 2 seconds or more and 6 seconds or less.

Furthermore, there is a second period T2 from the start of supply of the nitrogen-containing gas (S202) to the start of application of microwave (S204). The second period T2 is longer than the time required for stabilizing the pressure fluctuation in the processing container 10 after starting the supply of the nitrogen-containing gas. For example, the second period T2 is 20 seconds or more.

In addition, the period (T2−T1) from the start of supply of the nitrogen-containing gas (S202) to the start of supply of the Si precursor gas (S203) is longer than the time required for stabilizing the pressure fluctuation inside the processing container 10 after starting the supply of the nitrogen-containing gas. For example, the period (T2−T1) is preferably 10 seconds or more.

Further, there is a third period T3 from the start of application of the microwave (S204) to the start of supply of the dilution gas (S205). The third period T3 is longer than the time required for stabilizing the pressure fluctuation within the processing container 10 after starting plasma generation. The third period T3 is preferably 1 second or more and 5 seconds or less, for example, 2 seconds or more.

Although it has been described that the supply of the Si precursor gas into the processing container 10 from the first gas shower portion 21 is started in step S203, and the supply of the Si precursor gas into the processing container 10 from the second gas shower portion 22 may be started in step S205, the present disclosure is not limited thereto. In step S203, the supply of the Si precursor gas into the processing container 10 from the first gas shower portion 21 and the second gas shower portion 22 may be started.

Further, the dilution gas is not limited to being supplied from the second gas shower portion 22, and may be supplied from at least one of the first gas shower portion 21, the second gas shower portion 22, or the third gas shower portion 23.

An example of process conditions for forming a silicon nitride film is as follows.

<Process Conditions>

$SiH_4$ flow rate: 10 sccm to 100 sccm

Pressure inside processing container 10: 6 Pa to 133 Pa

Microwave power: 1,000 to 6,000 W

Next, a process of forming a silicon nitride film on a graphene film will be further described with reference to FIGS. 6A to 6D. FIGS. 6A to 6D are examples of a schematic diagram of a film formed on a substrate W.

Figure 6A:
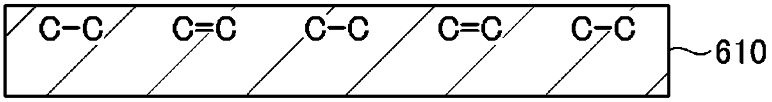
FIGS. 6A to 6D are examples of a schematic diagram of a film formed on a substrate.

As shown in FIG. 6A, carbon (C) stably exists on the surface of a graphene film 610 through single bonds or double bonds.

Figure 6B:
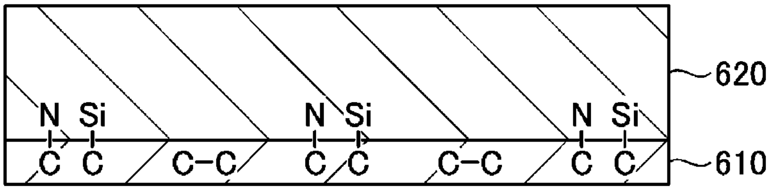

FIG. 6B shows a case where a silicon nitride film 620 is formed on a graphene film 610 using another method of forming a silicon nitride film. In this case, first, a nitrogen-containing gas is supplied into the processing container 10. Next, after supplying the nitrogen-containing gas, plasma is ignited. After the plasma ignition, a Si precursor gas is supplied into the processing container 10. When the silicon nitride film 620 is formed on the graphene film 610 by such a process, the graphene film 610 is etched by being exposed to the plasma of the nitrogen-containing gas. Thus, the graphene film 610 is thinned. On the other hand, bonds between carbon (C) on the surface of the graphene film 610 is broken, and carbon (C) is bonded with silicon (Si) and nitrogen (N) in the silicon nitride film 620, resulting in good adhesion between the graphene film 610 and the silicon nitride film 620.

Figure 6C:
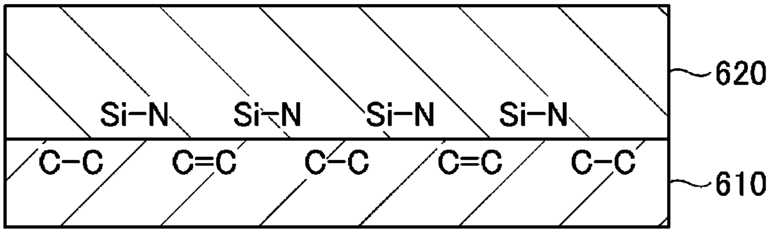

FIG. 6C shows a case where a silicon nitride film 620 is formed on a graphene film 610 by yet another method of forming a silicon nitride film. In this case, first, a nitrogen-containing gas and a Si precursor gas are supplied into the processing container 10. Next, after supplying the nitrogen-containing gas and the Si precursor gas, plasma is ignited. When the silicon nitride film 620 is formed on the graphene film 610 by such a process, the thinning of the graphene film 610 can be suppressed. On the other hand, since the silicon nitride film grows rapidly after the plasma ignition, the bonding between carbon (C) on the surface of the graphene film 610 is suppressed. Further, the bonding between carbon (C) and silicon (Si) in the silicon nitride film 620 or the bonding between carbon (C) and nitrogen (N) in the silicon nitride film 620 is suppressed. Therefore, the adhesion between the graphene film 610 and the silicon nitride film 620 deteriorates.

Figure 6D:
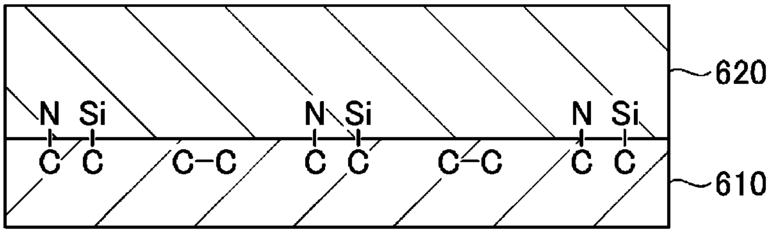

FIG. 6D shows a case where a silicon nitride film 620 is formed on a graphene film 610 by the method of forming a silicon nitride film according to the embodiment shown in FIGS. 2 to 5. When the silicon nitride film 620 is formed on the graphene film 610 by such a process, the thinning of the graphene film 610 is suppressed, and the good adhesion between the graphene film 610 and the silicon nitride film 620 is achieved.

Figure 7:
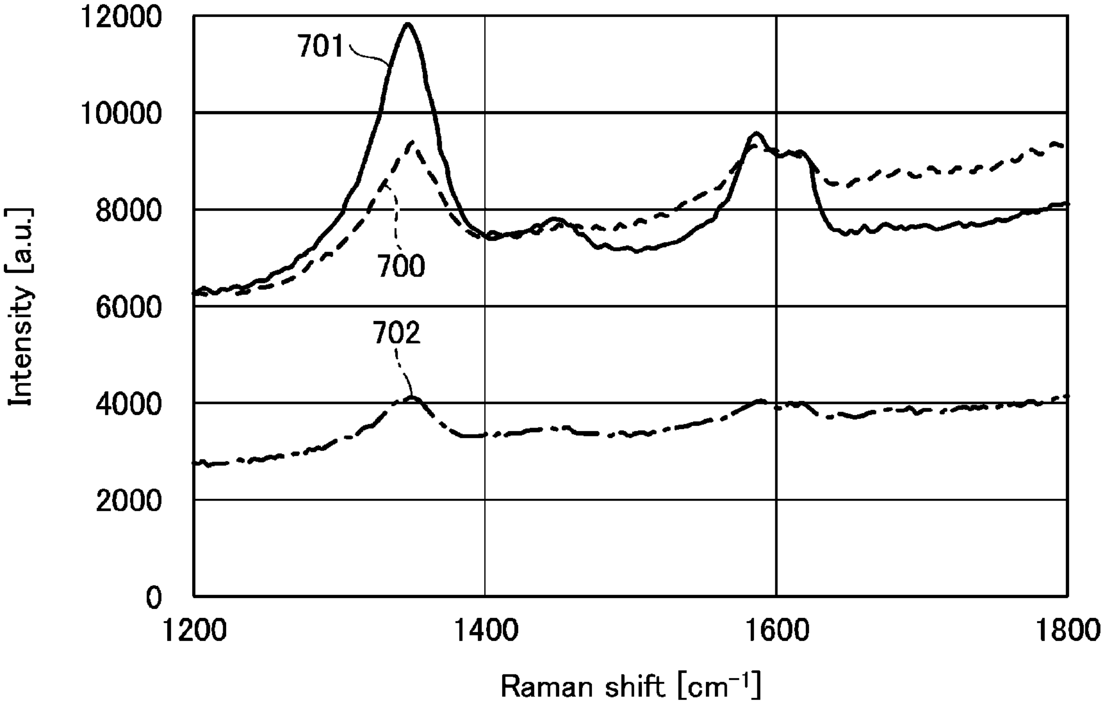
FIG. 7 is an example of the results of Raman spectroscopy when a silicon nitride film is formed on a graphene film using an $N_2$ gas as a nitrogen-containing gas.

Next, experimental results will be explained with reference to FIGS. 7 and 8. FIG. 7 shows an example of the results of Raman spectroscopy when a silicon nitride film is formed on a graphene film using an $N_2$ gas as a nitrogen-containing gas. A broken line 700 indicates the detection result when a silicon nitride film is formed on a graphene film by the process shown in FIG. 6C. A solid line 701 indicates the detection result when the first period T1 is 2 seconds. A dashed-dotted line 702 indicates the detection result when the first period T1 is 4 seconds.

Here, the peak appearing between 1300 [$cm^{-1}$] and 1400 [$cm^{-1}$] indicates that the graphene film remains.

In either case where the first period T1 is set to 2 seconds or 4 seconds, a peak was observed, indicating that the graphene film remains.

Figure 8:
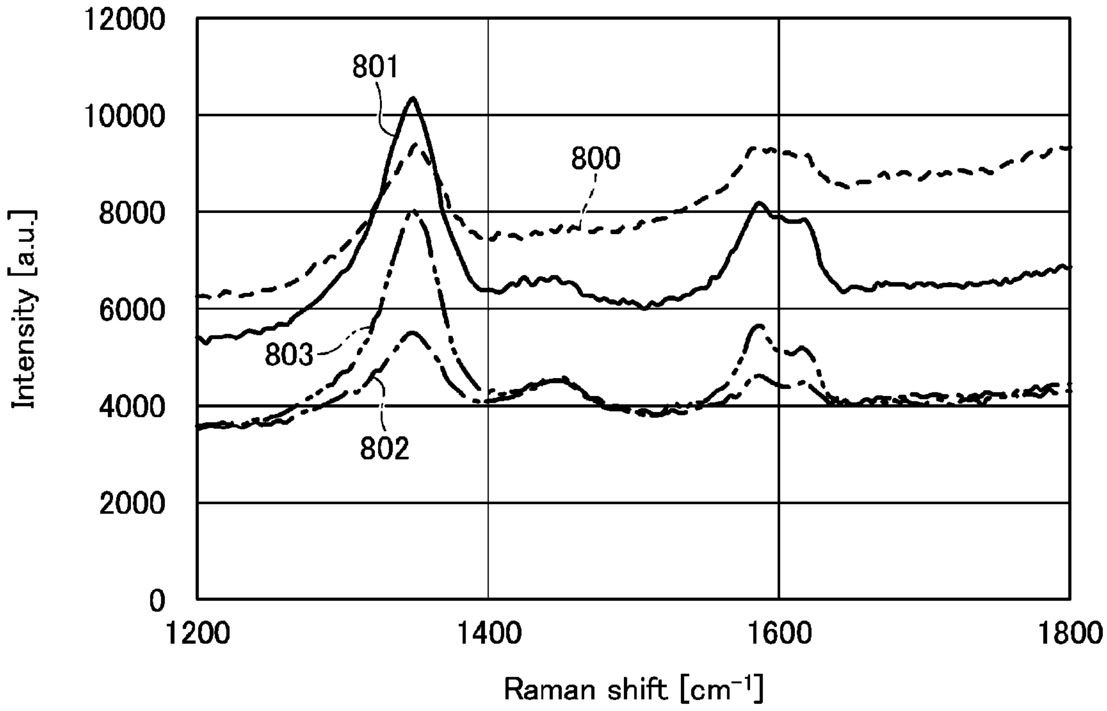
FIG. 8 is an example of the results of Raman spectroscopy when a silicon nitride film is formed on a graphene film using an $NH_3$ gas as a nitrogen-containing gas.

FIG. 8 shows an example of the results of Raman spectroscopy when a silicon nitride film is formed on a graphene film using an $NH_3$ gas as a nitrogen-containing gas. A broken line 800 indicates the detection result when a silicon nitride film is formed on a graphene film by the process shown in FIG. 6C. A solid line 801 indicates the detection result when the first period T1 is 2 seconds. A dashed-dotted line 802 indicates the detection result when the first period T1 is 4 seconds. A dashed-double dotted line 803 indicates the detection result when the first period T1 is set to 2 seconds and the Si precursor gas is supplied from the first gas shower portion 21 and the second gas shower portion 22 in step S103.

In either case where the first period T1 is set to 2 seconds or 4 seconds, a peak was observed, indicating that the graphene film remains. Further, even when the Si precursor gas is supplied from the first gas shower portion 21 and the second gas shower portion 22 in step S203, it can be seen that the graphene film remains because a peak is observed.

In addition, a silicon nitride film was formed on the graphene film using an $N_2$ gas or an $NH_3$ gas as a nitrogen-containing gas, and the adhesion between the graphene film and silicon nitride film was tested using a test method based on "JISK5400-8.5".

In this case, in the substrate W on which the silicon nitride film was formed by the process shown in FIG. 6C, it was confirmed that the silicon nitride film was peeled off from the graphene film.

On the other hand, in the substrate W on which the silicon nitride film was formed by the process shown in FIG. 6B, it was confirmed that the silicon nitride film was not peeled off from the graphene film and had good adhesion.

Further, in the substrate W on which the silicon nitride film is formed by the process of the method of forming a silicon nitride film according to the embodiment shown in FIGS. 2 to 5 (the process shown in FIG. 6D), tests were conducted for a case where an $N_2$ gas is used as the nitrogen-containing gas and the first period T1 is set to 2 seconds, a case where an $N_2$ gas is used as the nitrogen-containing gas and the first period T1 is set to 4 seconds, a case where an $NH_3$ gas is used as the nitrogen-containing gas and the first period T1 is set to 2 seconds, and a case where an $NH_3$ gas is used as the nitrogen-containing gas and the period T1 is set to 4 seconds. In either case, it was confirmed that the silicon nitride film is not peeled off from the graphene film and had good adhesion.

As described above, it was confirmed that, by igniting the plasma after the Si precursor gas is supplied and before the pressure control in the processing container 10 is stabilized, the adhesion between the graphene film and the silicon nitride film can be improved while suppressing the thinning of the graphene film.

Although the method of forming a silicon nitride film according to one embodiment using the plasma processing apparatus 1 has been described above, the present disclosure is not limited to the above-described embodiment. Various modifications and improvements may be made within the scope of the gist of the present disclosure recited in the claims.

According to the present disclosure in some embodiments, it is possible to provide a method of forming a silicon nitride film that suppresses the thinning of a graphene film and improves the adhesion between the graphene film and a silicon nitride film when forming the silicon nitride film on the graphene film.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a silicon nitride film, comprising:
preparing a substrate in a processing container, the substrate having a graphene film on a surface of the substrate;
supplying a nitrogen-containing gas into the processing container;
supplying a Si precursor gas into the processing container after the nitrogen-containing gas is supplied and after a pressure control inside the processing container is stabilized by controlling an exhauster connected to the processing container;
generating plasma within the processing container by supplying radio-frequency power for plasma generation after a first period is elapsed from a start of the supply of the Si precursor gas and while a pressure inside the processing container is fluctuating due to the supply of the Si precursor gas;
supplying a dilution gas into the processing container; and
forming the silicon nitride film on the graphene film by exposing the substrate to the plasma,
wherein a start of the supply of the dilution gas is after a start of the supply of the radio-frequency power;
wherein the supply of the nitrogen-containing gas and the supply of the Si precursor gas are maintained during the supply of the dilution gas, and
wherein the supply of the nitrogen-containing gas, the Si precursor gas, and the dilution gas are stopped when the radio-frequency power is turned off.

2. The method of claim 1, wherein the first period is a period from the start of the supply of the Si precursor gas to a start of the supply of the radio-frequency power, and
wherein the first period is 1 second or more and 10 seconds or less.

3. The method of claim 1, wherein a second period is a period from a start of the supply of the nitrogen-containing gas to a start of the supply of the radio-frequency power, and
wherein the second period is 20 seconds or more.

4. The method of claim 1, wherein a third period is a period from the start of the supply of the radio-frequency power to the start of the supply of the dilution gas, and
wherein the third period is 1 second or more and 5 seconds or less.

5. The method of claim 1, wherein the processing container has a first gas supply hole that supplies a gas from a top wall of the processing container and a second gas supply hole that supplies a gas from a side wall of the processing container, and
wherein in the supplying the Si precursor gas, the Si precursor gas is supplied from the first gas supply hole.

6. The method of claim 5, wherein in the supplying the dilution gas, the dilution gas and the Si precursor gas are supplied from the second gas supply hole.

7. The method of claim 6, wherein a flow rate ratio of the Si precursor gas supplied from the first gas supply hole to the Si precursor gas supplied from the second gas supply hole is 1:7 or more and 1:3 or less.

8. The method of claim 1, wherein the processing container includes a first gas supply hole that supplies a gas from a top wall of the processing container and a second gas supply hole that supplies a gas from a side wall of the processing container, and
wherein in the supplying the Si precursor gas, the Si precursor gas is supplied from the first gas supply hole and the second gas supply hole.

9. The method of claim 8, wherein a flow rate ratio of the Si precursor gas supplied from the first gas supply hole to the Si precursor gas supplied from the second gas supply hole is 1:7 or more and 1:3 or less.

10. The method of claim 1, wherein the radio-frequency power is microwave power.

11. The method of claim 1, wherein the nitrogen-containing gas includes at least one of $NH_3$, $N_2$, or a mixed gas of $N_2$ and $H_2$.

12. The method of claim 1, wherein in the supplying the nitrogen-containing gas, at least one of an oxygen-containing gas or a carbon-containing gas is supplied together with the nitrogen-containing gas.

13. The method of claim 1, wherein the Si precursor gas is a $SiH_4$ gas.

14. The method of claim 1, wherein the silicon nitride film is one of a SiN film, a SiON film, a SiCN film, and a SiOCN film.

* * * * *